United States Patent
Tao et al.

(10) Patent No.: US 12,286,722 B2
(45) Date of Patent: *Apr. 29, 2025

(54) LIGHT-INDUCED ALUMINUM PLATING ON SILICON FOR SOLAR CELL METALLIZATION

(71) Applicant: Arizona Board of Regents on behalf of Arizona State University, Scottsdale, AZ (US)

(72) Inventors: Meng Tao, Fountain Hills, AZ (US); Laidong Wang, Cupertino, CA (US)

(73) Assignee: ARIZONA BOARD OF REGENTS ON BEHALF OF ARIZONA STATE UNIVERSITY, Scottsdale, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/586,085

(22) Filed: Feb. 23, 2024

(65) Prior Publication Data

US 2024/0240346 A1 Jul. 18, 2024

Related U.S. Application Data

(60) Continuation of application No. 17/725,855, filed on Apr. 21, 2022, now Pat. No. 11,932,960, which is a
(Continued)

(51) Int. Cl.
| | |
|---|---|
| *C25D 3/66* | (2006.01) |
| *C25D 3/54* | (2006.01) |
| *C25D 5/00* | (2006.01) |
| *C25D 5/10* | (2006.01) |
| *C25D 5/50* | (2006.01) |

(Continued)

(52) U.S. Cl.
CPC ............ *C25D 3/665* (2013.01); *C25D 3/54* (2013.01); *C25D 5/011* (2020.08); *C25D 5/10* (2013.01); *C25D 5/50* (2013.01); *C25D 7/12* (2013.01); *H01L 31/022425* (2013.01); *H01L 31/022458* (2013.01); *H01L 31/028* (2013.01); *H01L 31/068* (2013.01); *H01L 31/0682* (2013.01); *H01L 31/1804* (2013.01)

(58) Field of Classification Search
CPC ........ C25D 3/665; C25D 5/011; C25D 5/006; C25D 5/024
See application file for complete search history.

(56) References Cited

U.S. PATENT DOCUMENTS

| | | | | |
|---|---|---|---|---|
| 4,507,181 A | * | 3/1985 | Nath | ............... C25D 7/126 136/258 |
| 2008/0035489 A1 | * | 2/2008 | Allardyce | ........... C23C 18/1608 205/291 |

(Continued)

*Primary Examiner* — Brian W Cohen
(74) *Attorney, Agent, or Firm* — Snell & Wilmer L.L.P.

(57) ABSTRACT

Methods for light-induced electroplating of aluminum are disclosed herein. Exemplary methods may comprise preparing an ionic liquid comprising aluminum chloride ($AlCl_3$) and an organic halide, placing the silicon substrate into the ionic liquid, illuminating the silicon substrate, the illumination passing through the ionic liquid, and depositing aluminum onto the silicon substrate via a light-induced electroplating process, wherein the light-induced electroplating process utilizes an applied current that does not exceed a photo-generated current generated by the illumination.

19 Claims, 18 Drawing Sheets

Related U.S. Application Data continuation of application No. 16/113,822, filed on Aug. 27, 2018, now abandoned, said application No. 17/725,855 is a continuation-in-part of application No. 16/432,702, filed on Jun. 5, 2019, now Pat. No. 11,682,739, which is a division of application No. 15/079,359, filed on Mar. 24, 2016, now abandoned, which is a continuation of application No. PCT/US2014/067338, filed on Nov. 25, 2014.

(60) Provisional application No. 62/551,037, filed on Aug. 28, 2017, provisional application No. 62/055,378, filed on Sep. 25, 2014, provisional application No. 62/018,320, filed on Jun. 27, 2014, provisional application No. 61/908,824, filed on Nov. 26, 2013.

(51) Int. Cl.
*C25D 7/12* (2006.01)
*H01L 31/0224* (2006.01)
*H01L 31/028* (2006.01)
*H01L 31/068* (2012.01)
*H01L 31/18* (2006.01)

(56) References Cited

U.S. PATENT DOCUMENTS

| | | | |
|---|---|---|---|
| 2010/0108524 A1* | 5/2010 | van Mol | H10K 50/844 205/91 |
| 2011/0278172 A1* | 11/2011 | Cotte | C23C 18/06 205/91 |
| 2015/0144495 A1* | 5/2015 | Chen | C25D 21/18 205/261 |
| 2016/0204289 A1* | 7/2016 | Tao | C25D 7/126 136/256 |

\* cited by examiner

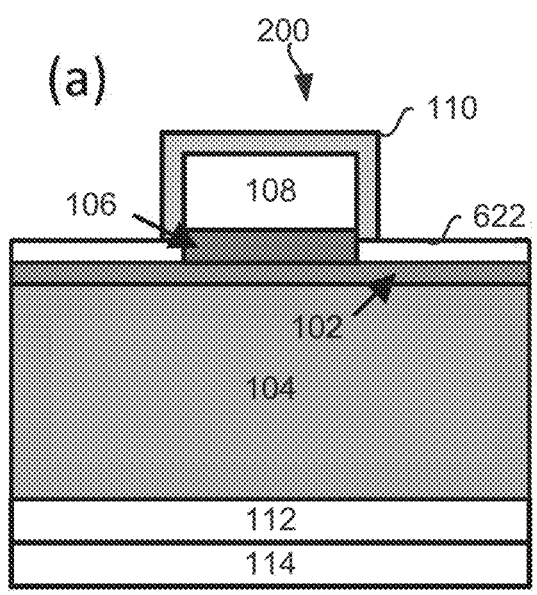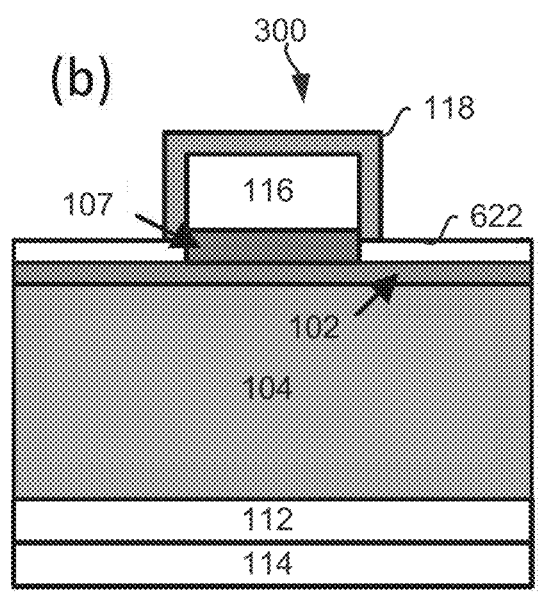
FIG. 1a
Prior Art
FIG. 1b
Prior Art

LIGHT-INDUCED ALUMINUM PLATING ON SILICON FOR SOLAR CELL METALLIZATION

CROSS REFERENCE TO RELATED APPLICATIONS

This application is a continuation of U.S. Ser. No. 17/725,855 filed on Apr. 21, 2022, now U.S. Patent Application Publication No. 2022-0243351 entitled "LIGHT-INDUCED ALUMINUM PLATING ON SILICON FOR SOLAR CELL METALLIZATION." U.S. Ser. No. 17/725,855 is a continuation of U.S. Ser. No. 16/113,822 filed on Aug. 27, 2018, now U.S. Patent Application Publication No. 2019-0067498 entitled "LIGHT-INDUCED ALUMINUM PLATING ON SILICON FOR SOLAR CELL METALLIZATION." U.S. Ser. No. 16/113,822 claims priority to, and the benefit of, U.S. Provisional Patent Application No. 62/551,037, filed on Aug. 28, 2017, entitled "LIGHT-INDUCED ALUMINUM PLATING ON SILICON FOR SOLAR CELL METALLIZATION."

U.S. Ser. No. 17/725,855 is also a continuation-in-part of U.S. Ser. No. 16/432,702 filed on Jun. 5, 2019, now U.S. Pat. No. 11,682,739 issued on Jun. 20, 2023, entitled "SOLAR CELLS FORMED VIA ALUMINUM ELECTROPLATING." U.S. Ser. No. 16/432,702 is a division of U.S. Ser. No. 15/079,359 filed on Mar. 24, 2016, now U.S. Patent Application Publication No. 2016-0204289 entitled "SOLAR CELLS FORMED VIA ALUMINUM ELECTROPLATING." U.S. Ser. No. 15/079,359 is a continuation of PCT Serial No. PCT/US2014/067338 filed on Nov. 25, 2014, now WIPO Publication WO 2015-081077 entitled "SOLAR CELLS FORMED VIA ALUMINUM ELECTROPLATING." PCT Serial No. PCT/US2014/067338 claims priority to, and the benefit of: (i) U.S. Provisional Patent Application No. 62/055,378 filed on Sep. 25, 2014 and entitled "SOLAR CELLS FORMED VIA ALUMINUM ELECTROPLATING;"

(ii) U.S. Provisional Patent Application No. 62/018,320 filed on Jun. 27, 2014 and entitled "ALUMINUM ELECTROPLATING OF SOLAR CELLS;" and (iii) U.S. Provisional Patent Application No. 61/908,824 filed on Nov. 26, 2013 and entitled "SILICON PHOTOVOLTAIC SOLAR CELLS WITH ELECTRO-PLATED ALUMINUM ELECTRODES."

Each of the foregoing applications are hereby incorporated by reference, including but not limited to those portions that specifically appear hereinafter, but except for any subject matter disclaimers or disavowals, and except to the extent that the incorporated material is inconsistent with the express disclosure herein, in which case the language in this disclosure shall control.

FEDERALLY SPONSORED RESEARCH OR DEVELOPMENT

This invention was made with government support under 1336297 awarded by the National Science Foundation. The Government has certain rights in the invention.

TECHNICAL FIELD

The present disclosure relates to materials deposition, and in particular to electroplating of aluminum in connection with silicon solar cells.

BACKGROUND

Increasing expense and limited supply of silver has generated interest in alternative materials for use in connection with electrodes in silicon solar cells. However, common alternatives, such as copper, suffer from various drawbacks, for example a need for barrier layers, protective layers, and so forth. Accordingly, improved solar cells and methods related to fabrication of the same remain desirable.

SUMMARY

A method for light-induced electroplating of aluminum directly onto a silicon substrate is disclosed herein. In various embodiments, the method comprises preparing an ionic liquid comprising aluminum chloride ($AlCl_3$) and an organic halide, placing the silicon substrate into the ionic liquid, illuminating the silicon substrate, the illumination passing through the ionic liquid, and depositing aluminum onto the silicon substrate via a light-induced electroplating process, wherein the light-induced electroplating process utilizes an applied current that does not exceed a photo-generated current generated by the illumination.

In various embodiments, the method further comprises cleaning the silicon substrate with at least one of hydrogen fluoride, hydrogen chloride, hydrogen peroxide, sodium hydroxide, potassium hydroxide, or ammonium hydroxide. In various embodiments, the method further comprises patterning a partially-processed silicon solar cell to expose the silicon substrate. In various embodiments, the patterning comprises at least one of laser ablation or lithography. In various embodiments, the method further comprises cleaning the deposited aluminum with deionized water. In various embodiments, the method further comprises annealing the deposited aluminum and the silicon substrate to reduce a resistivity of the deposited aluminum. In various embodiments, the organic halide is 1-ethyl-3-methylimidazolium tetrachloraluminate ($EMIm-AlCl_4$). In various embodiments, the light-induced electroplating process utilizes a two-electrode electrolyzer. In various embodiments, the two-electrode electrolyzer, an anode comprises an aluminum wire mesh, and a cathode comprises the silicon substrate. In various embodiments, the light-induced electroplating process comprises applying a voltage between the anode and the cathode to achieve a current of between 5 milliamps per centimeter squared and 50 milliamps per centimeter squared. In various embodiments, the depositing is performed with the ionic liquid at a temperature of between 20 degrees Celsius and 150 degrees Celsius. In various embodiments, the depositing is performed with the ionic liquid at a temperature of about 100 degrees Celsius or greater. In various embodiments, the depositing occurs in an inert ambient atmosphere. In various embodiments, the illumination comprises a wavelength of between 600 nanometers and 1000 nanometers. In various embodiments, the ionic liquid is disposed in a container having a transparent bottom, and wherein the illumination is provided by light emitting diodes disposed below the bottom of the container.

An n-type back-emitter solar cell is disclosed herein, the solar cell comprising a front finger electrode comprising aluminum and formed by light-induced electroplating of aluminum onto silicon over a patterned silicon nitride layer, and a back electrode comprising aluminum and formed by screen printing, wherein an electrical contact between the front finger electrode and a silicon substrate of the solar cell is formed by annealing at a temperature between 100 degrees Celsius and 500 degrees Celsius.

In various embodiments, the light-induced electroplating of aluminum onto silicon is performed at a temperature of between 20 degrees Celsius and 150 degrees Celsius. In various embodiments, the solar cell is configured with efficiency above 15%. In various embodiments, the solar cell further comprises a zinc capping layer.

A method for processing a silicon solar cell comprises preparing an ionic liquid comprising aluminum chloride ($AlCl_3$) and 1-ethyl-3-methylimidazolium tetrachloroaluminate ($EMIm-AlCl_4$), patterning a partially-processed silicon solar cell to expose an n-type surface of a silicon substrate, cleaning the n-type surface with at least one of hydrogen fluoride, hydrogen chloride, hydrogen peroxide, sodium hydroxide, potassium hydroxide, or ammonium hydroxide, bringing the n-type surface into contact with the ionic liquid; illuminating n-type surface, wherein the illumination passes through the ionic liquid and comprises a wavelength between about 600 nanometers and 1000 nanometers, depositing aluminum onto the silicon substrate via a light-induced electroplating process, wherein the light-induced electroplating process comprises applying a current between an aluminum back electrode of the partially-processed silicon solar cell and an aluminum mesh disposed in the ionic liquid, cleaning the deposited aluminum with deionized water, and annealing the deposited aluminum and the n-type surface to reduce the resistivity of the electroplated aluminum.

BRIEF DESCRIPTION OF THE DRAWINGS

With reference to the following description and accompanying drawings:

FIGS. 1a and 1b illustrate electrodes for silicon solar cells known in the prior art;

DETAILED DESCRIPTION

Figure 1C:
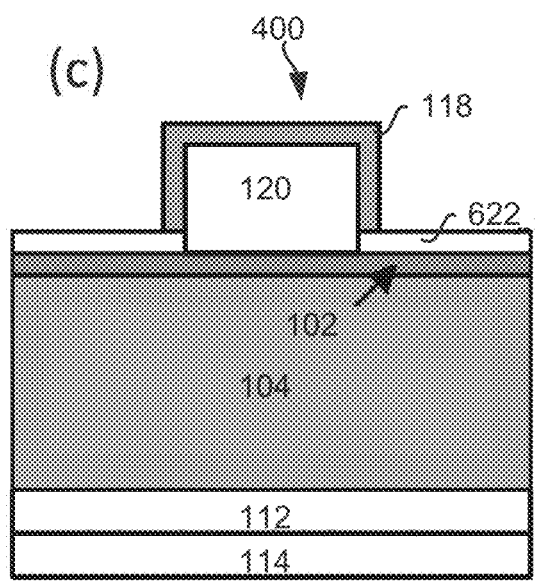
FIG. 1c illustrates a light-induced aluminum electrode in accordance with an exemplary embodiment.

The following description is of various exemplary embodiments only, and is not intended to limit the scope, applicability or configuration of the present disclosure in any way. Rather, the following description is intended to provide a convenient illustration for implementing various embodiments including the best mode. As will become apparent, various changes may be made in the function and arrangement of the elements described in these embodiments without departing from principles of the present disclosure.

For the sake of brevity, conventional techniques for materials deposition, electroplating, silicon solar cell fabrication, and the like may not be described in detail herein. Furthermore, the connecting lines shown in various figures contained herein are intended to represent exemplary functional relationships and/or physical couplings between various elements. It should be noted that many alternative or additional functional relationships or physical connections may be present in a practical silicon solar cell and/or method for electroplating of aluminum.

Prior solar cells suffer from various deficiencies. For example, many solar cells utilize silver for an electrode or electrodes. However, silver is increasing in expense and decreasing in availability. A common alternative, copper, requires barrier layers and/or protective layers, increasing complexity and cost. In contrast, these and other shortcomings of prior approaches may be overcome by utilizing principles of the present disclosure, for example as illustrated in various exemplary embodiments. For example, by utilizing light-induced electroplating of aluminum, silicon solar cells having acceptable performance and reduced cost may be achieved.

Light-induced aluminum plating as disclosed herein allows direct deposition of aluminum on highly-resistive silicon, thus eliminating the need for a seed layer between aluminum and silicon. As compared to copper plating, it simplifies the aluminum plating process for silicon solar cells and reduces the manufacturing cost of aluminum plating. Exemplary silicon solar cells which are compatible with the light-induced aluminum plating process are disclosed herein.

Silver is commonly used as the front finger electrode in today's silicon solar cells. In 2016, about 2,600 tonnes of silver were consumed for the production of about 73 GWp silicon solar cells. Though silver has several advantages as the front electrode in silicon solar cells, there are two major issues with future prospects of silver in silicon solar cells. The first issue is the high price of silver. Currently, the cost of silver in silicon cells is about $0.022/Wp while the price of the solar cell is about $0.20/Wp, meaning that silver contributes to about 10% of the cost of a silicon solar cell. The second issue is the limited reserve of silver on this planet. Per the U.S. Geological Survey, the global known reserve of silver is 570,000 tonnes. Based on the silver consumption to solar cell production ratio of 2016, the silver reserve would allow the production of 16 TWp of silicon solar cells if all the silver reserve were exclusively used for silicon solar cell production. 16 TWp of solar cells would meet only about 8% of the projected global energy demand in 2040.

Technologies are being developed to replace silver in silicon solar cells with an Earth-abundant, low-cost, and low-resistivity metal. The candidate metals which meet these requirements include copper and aluminum. However, there is a major disadvantage for copper as the front electrode in silicon solar cells. Copper is detrimental to the minority carrier lifetime in silicon and can significantly reduce the efficiency of the solar cell, so it cannot be deposited directly on silicon. A barrier layer, typically made of electroplated nickel, is required between copper and silicon to prevent copper from touching silicon.

Principles of the present disclosure may be utilized in connection with principles disclosed in U.S. patent application Ser. No. 15/079,359 filed on Mar. 24, 2016, now U.S. Patent Application Publication No. 2016-0204289 entitled "SOLAR CELLS FORMED VIA ALUMINUM ELECTROPLATING", the contents of which are hereby incorporated by reference in their entirety for all purposes, and which disclose an electroplating process of aluminum to replace silver in silicon solar cells. Aluminum is benign to silicon and has been used in direct contact with silicon in solar cells for decades. Although no barrier layer is needed between aluminum and silicon, a seed layer, typically made of electroplated nickel, is still required to facilitate conventional aluminum plating on silicon due to the highly resistive silicon.

In accordance with principles of the present disclosure, a new electroplating process and associated equipment for aluminum is disclosed, i.e., light-induced aluminum plating. Light-induced plating has not previously been explored for aluminum deposition on silicon solar cells. Because the plating current is photo-generated across the entire solar cell, there is no need for a seed layer in light-induced plating. FIG. 1a illustrates a plated copper electrode 200 as known in the prior art, including n-type emitter 102, p-type base 104, electroplated nickel barrier layer 106, copper front electrode 108, tin capping layer 110, back surface field 112, and back electrode 114. FIG. 1b illustrates a conventional plated aluminum electrode 300 as known in the prior art, including n-type emitter 102, p-type base 104, electroplated nickel seed layer 107, aluminum front electrode 116, zinc capping layer 118, back surface field 112, and back electrode 114. FIG. 1c illustrates a light-induced aluminum electrode 400 in accordance with principles of the present disclosure. In various embodiments, light-induced aluminum electrode 400 comprises n-type emitter 102, p-type base 104, direct plated aluminum front finger electrode 120, zinc capping layer 118, back surface field 112, and back electrode 114, among other elements.

Without a barrier or seed layer, principles of the present disclosure simplify the conventional aluminum plating process for silicon solar cells, and also reduce the manufacturing cost of aluminum plating as compared to copper plating.

In addition, several silicon solar cells which are compatible with the light-induced aluminum plating process are described.

The back electrode in certain exemplary solar cells disclosed herein is made of screen-printed aluminum and the front electrode is made of light-induced aluminum, i.e., no silver is used as an electrode in these solar cells. In various embodiments, the ionic liquid for light-induced aluminum plating comprises aluminum. In various embodiments, the light source is of any wavelength which is transparent in the ionic liquid but is absorbed by silicon. The light-induced plating process may be carried out in air at a temperature slightly above room temperature but below 200° C., or in an inert gas at a temperature between room temperature and 200° C., or in vacuum at a temperature between room temperature and 200° C. In various embodiments, the light-induced aluminum electrode is in direct contact with a silicon substrate, for example, the front n-type silicon emitter of the solar cell.

Light-Induced Plating of Aluminum on Silicon

Figure 2A:
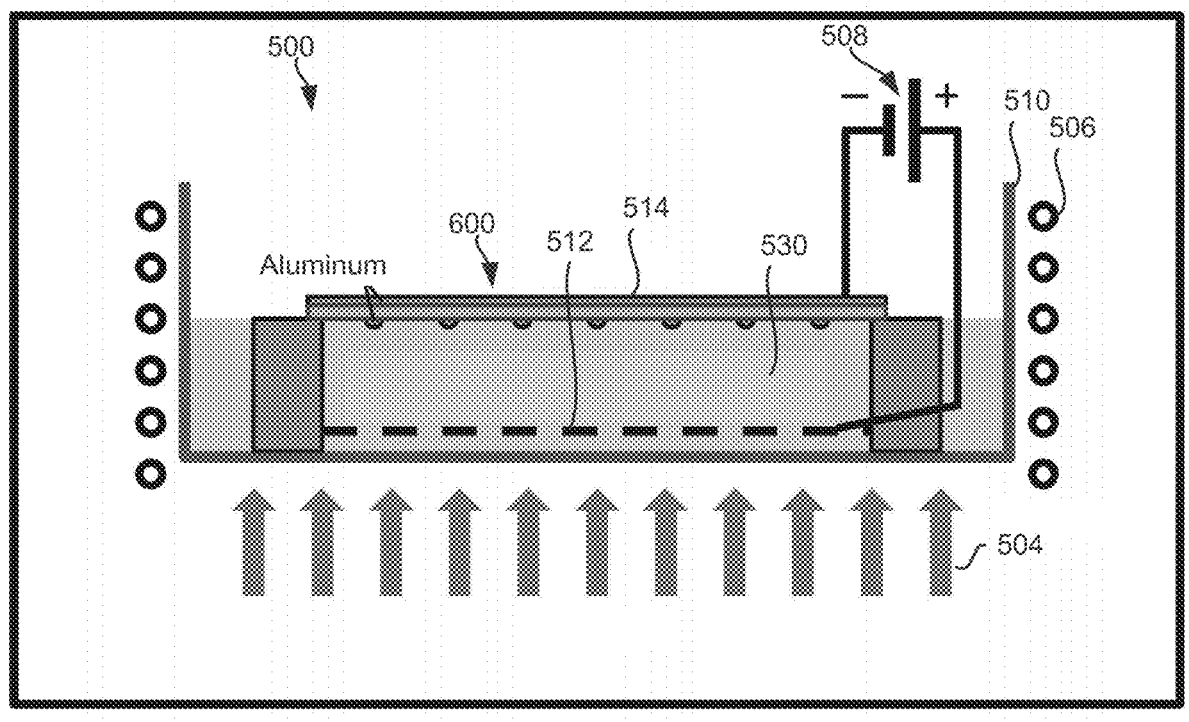
FIGS. 2a and 2b illustrate exemplary systems for light-induced aluminum plating on silicon solar cells in accordance with exemplary embodiments.

An important principle of the present disclosure is a method of light-induced plating of aluminum on silicon solar cells as disclosed herein. In an exemplary embodiment, a light-induced aluminum plating system 500, as shown in FIG. 2, includes several components: an ionic liquid 530, a light source 504, a heat source 506, a direct-current power supply 508, and a container 510. In various embodiments, a two-electrode configuration, with an anode 512 and a cathode 514, is employed. Anode 512 may be a mesh made of high-purity aluminum wires. Cathode 514 may be a back electrode of a partially-finished silicon solar cell ready for front electrode metallization. In various embodiments, cathode 514 may comprise an aluminum back electrode.

Figure 3:
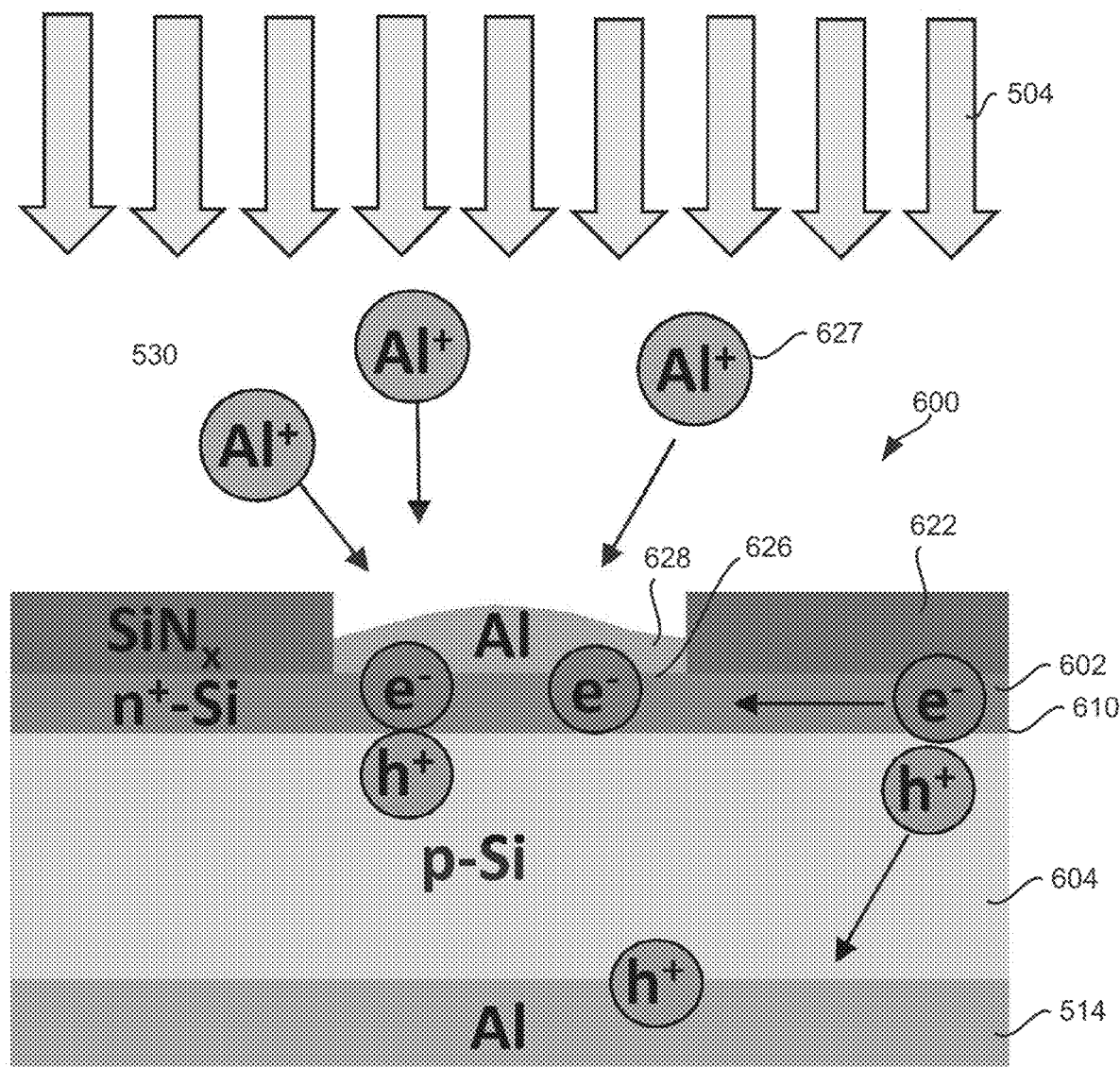
FIG. 3 illustrates light-induced aluminum plating on a silicon solar cell in accordance with an exemplary embodiment.

FIG. 3 shows a portion of the process of light-induced aluminum plating on a partially-processed silicon solar cell 600, in accordance with various embodiments. Partially-processed silicon solar cell 600 may comprise p-n junction 610 and cathode 514 on p-type base 604 of partially-processed silicon solar cell 600. In various embodiments, light-induced aluminum plating is performed on a silicon substrate. The silicon substrate may comprise n-type emitter 602 of partially-processed silicon solar cell 600. The silicon substrate may further comprise a silicon nitride layer 622 disposed on n-type emitter 602 of partially-processed silicon solar cell 600. Silicon nitride layer 622 may be patterned and/or otherwise treated to remove silicon nitride from some areas, thereby exposing an n-type surface 626, which comprises the silicon disposed at the junction between silicon nitride layer 622 and n-type emitter 602. In various embodiments, a light source 504 of suitable wavelength excites electrons of partially-processed silicon solar cell 600, and these photo-generated electrons create electron-hole pairs in partially-processed silicon solar cell 600. In various embodiments, p-n junction 610 drives photo-generated electrons toward n-type emitter 602 and holes toward p-type base 604 in response to stimulation from light source 504. On the areas of n-type surface 626 where silicon nitride is removed, the photo-generated electrons may reduce aluminum ions 627 in the ionic liquid 530, resulting in deposition of metallic aluminum 628 on n-type surface 626. Aluminum deposition may not occur on silicon nitride layer 622.

In various exemplary embodiments, ionic liquid 530 comprises aluminum. In an exemplary embodiment ionic liquid 530 comprises a commercially available ionic liquid, 1-ethyl-3-methylimidazolium tetrachloroaluminate (EMIm-AlCl$_4$). However, any suitable organic halide or other ionic liquid may be utilized in light-induced aluminum plating system 500. In various embodiments, ionic liquid 530 comprises EMIm-AlCl$_4$ and anhydrous AlCl$_3$ powder. Ionic liquid 530 may be prepared in a dry nitrogen box to prevent the ionic liquid from absorbing moisture. However, in various embodiments, ionic liquid may be prepared in a dry beaker at room temperature.

In various embodiments, the molar ratio of AlCl$_3$ to EMIm-AlCl$_4$ in ionic liquid 530 is more than zero, but less than one, making ionic liquid 530 a Lewis acid and/or enabling electroplating of aluminum. In various embodiments, the molar ratio of AlCl$_3$ to EMIm-AlCl$_4$ in ionic liquid 530 is about 0.5. However, any moral ratio suitable for aluminum electroplating may be utilized. After mixing AlCl$_3$ and EMIm-AlCl$_4$, a prebake step may be performed in which ionic liquid 530 is heated to about 120° C. for about one hour to drive out the residual moisture in it. In various embodiments, however, any suitable prebake time and/or prebake temperature may be utilized. In various embodiments, the color of prepared ionic liquid is yellow to brown.

Figure 4:
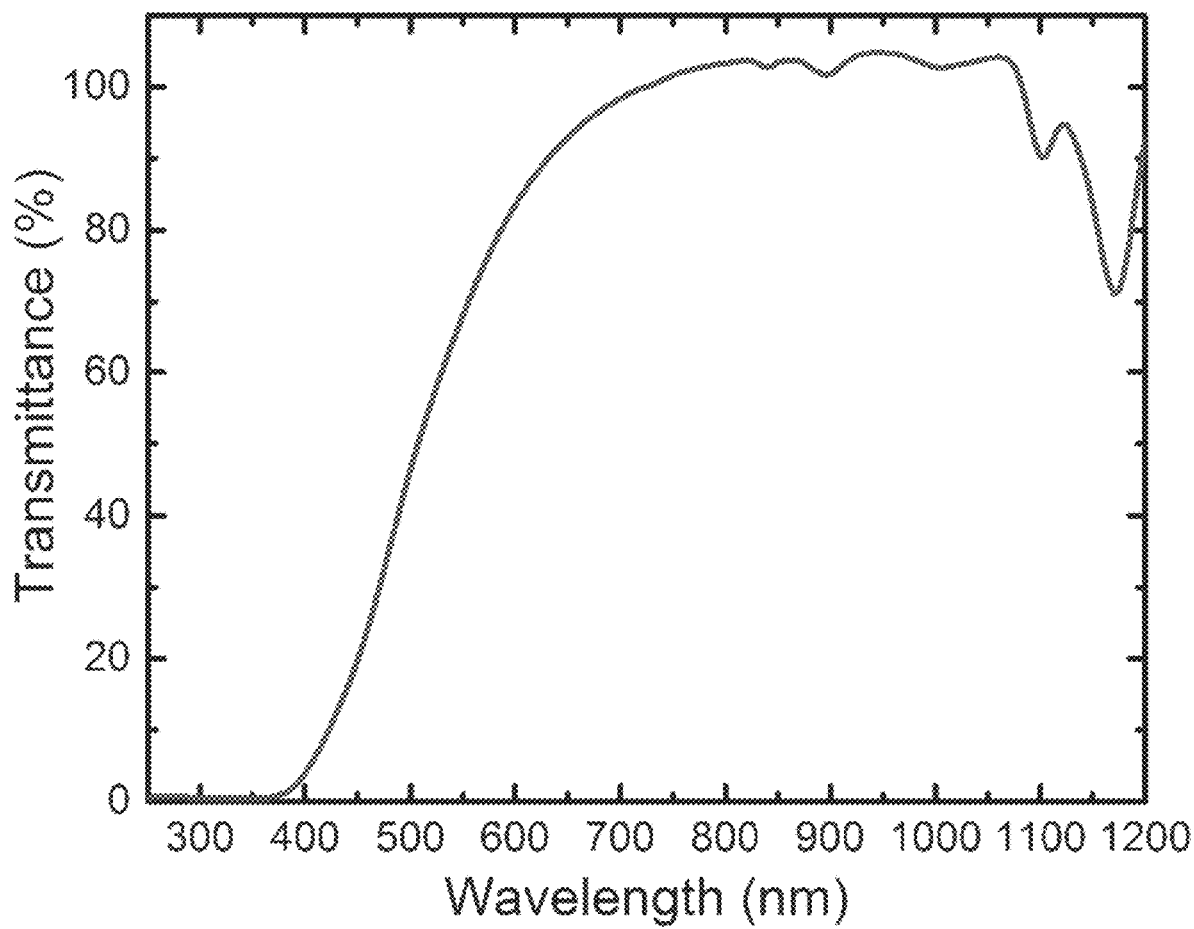
FIG. 4 illustrates a transmission spectrum of a prepared ionic liquid for light-induced aluminum plating in accordance with an exemplary embodiment.
Figure 5:
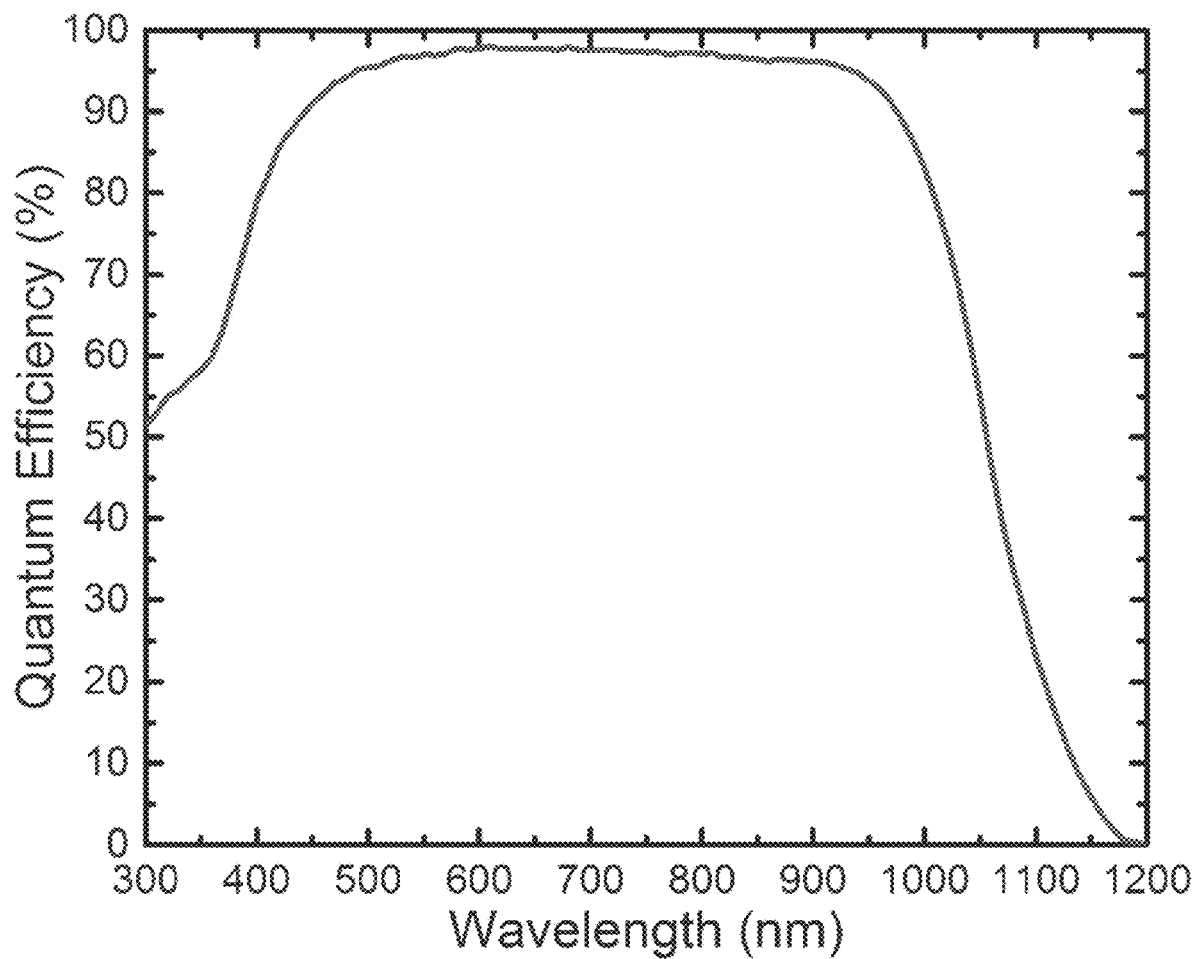
FIG. 5 illustrates external quantum efficiency of a partially-processed silicon solar cell in accordance with an exemplary embodiment.
Figure 6:
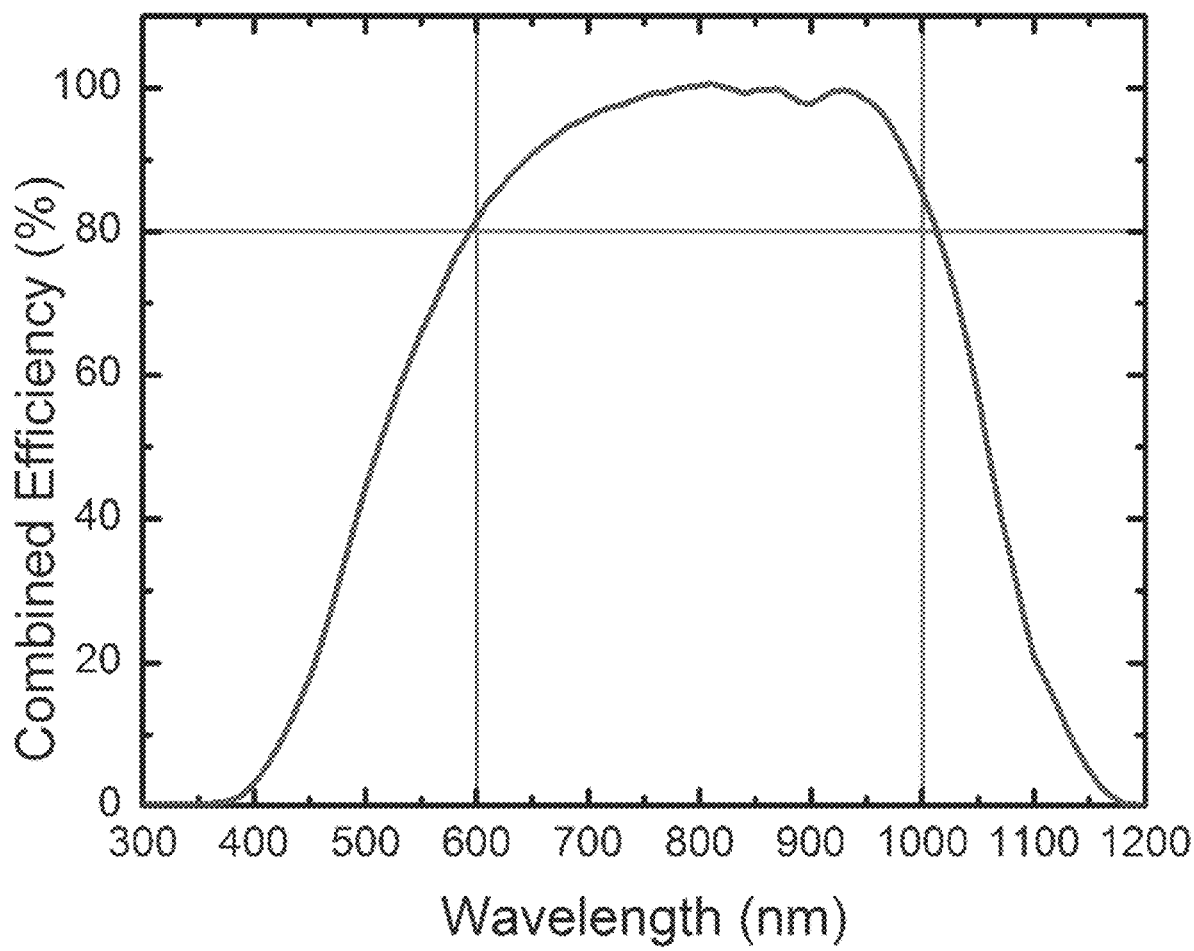
FIG. 6 illustrates a combined absorption spectrum of a partially-processed silicon solar cell in a prepared ionic liquid in accordance with an exemplary embodiment.

In an exemplary embodiment, light source 504 for light-induced aluminum plating is selected in response to the transmission spectrum of the prepared ionic liquid and the absorption spectrum of silicon. The transmission spectrum of ionic liquid 530, as shown in FIG. 4, was measured with a spectrophotometer in a quartz cuvette. The absorption spectrum of a partially-processed silicon solar cell, as shown in FIG. 5, was measured with an external quantum efficiency tester. The combined absorption spectrum, as illustrated in FIG. 6, was determined by the product of the transmission spectrum of ionic liquid 530 and the absorption spectrum of a partially-processed silicon solar cell at different illumination wavelengths. In various embodiments, a wavelength of light source 504 of between about 600 nm and about 1,000 nm results in about 80% absorption of light by the silicon solar cell. In various embodiments, light-induced aluminum plating system 500 comprises a light source 504 having a wavelength of between about 600 nm and about 1,000 nm, corresponding to visible red light and/or infrared light.

Light-induced aluminum plating system 500 may comprise light-emitting diodes (LEDs) with a single wavelength and/or lamps with a broad range of wavelength between about 600 nm and about 1,000 nm. However, light-induced aluminum plating system 500 may comprise a light source 504 having any suitable wavelength or wavelengths. In an exemplary embodiment, light source 504 comprises red LEDs with a wavelength of about 620 nm. A LED array may be built with an area larger than the size of the partially-processed silicon solar cell 600 to be plated with aluminum. The LED array may be placed beneath container 510, and container 510 may be transparent to the wavelength used, such that light may be transmitted through container 510, through ionic liquid 530, and towards partially-processed silicon solar cell 600. However, in various embodiments, light source 504 may be placed in any suitable portion of light-induced aluminum plating system 500.

In various embodiments, container 510 prevents ionic liquid 530 from absorbing moisture from the air. The ambient air in container 510 may be an inert gas such as nitrogen. Container 510 and/or at least some portion of light-induced aluminum plating system 500 may be disposed in a vacuum. However, in various embodiments, light-induced aluminum plating system 500 may be disposed in open air. When light-induced aluminum plating occurs in open air, ionic liquid 530 may heated to a temperature of between about 90° C. and about 200° C., to reduce moisture absorption by ionic liquid 530.

In an exemplary embodiment and with reference again to FIG. 3, cathode 514 comprises a partially-processed silicon solar cell 600 which lacks a front finger electrode. Partially-processed silicon solar cell 600 may be monocrystalline or multicrystalline. An appropriate pattern may be created in silicon nitride layer 622 of partially-processed silicon solar cell 600. The pattern may be created by laser ablation and may expose a silicon n-type surface 626 disposed beneath the silicon nitride layer 622. In various embodiments, a patterned silicon nitride layer may comprise openings of 10×0.5 mm$^2$.

Before plating, the patterned silicon nitride layer and/or the n-type surface 626 may be cleaned. In various embodiments, the cleaning may improve the efficiency and/or efficacy of direct aluminum deposition on silicon. An exemplary cleaning procedure is as follows: a partially-processed silicon cell with a patterned front silicon nitride layer and/or exposed n-type surface is dipped in an aqueous solution of hydrofluoric acid for less than one minute to remove native oxide in the pattern. The hydrofluoric acid may comprise a concentration of between about 1% and about 7%. In various embodiments, the concentration of hydrofluoric acid comprises 2%. In various embodiments, the concentration of hydrofluoric acid comprises 5%. The partially-processed silicon cell may be dipped in hydrofluoric acid for between about 15 seconds and about 45 seconds. In various embodiments, the partially-processed silicon cell is dipped in hydrofluoric acid for about 30 seconds. The partially-processed silicon cell is then immersed into an aqueous solution of sodium hydroxide for less than a minute to etch off a thin layer of damaged and/or contaminated silicon from the patterned n-type surface. In various embodiments, the sodium hydroxide concentration comprises 3%; however, any suitable concentration of sodium hydroxide may be used. The partially-processed silicon cell may be dipped in sodium hydroxide for between about 1 second and about 30 seconds. In various embodiments, the partially-processed silicon cell is dipped in sodium hydroxide for about 15 seconds. The sodium hydroxide etch step is desirably controlled to prevent over-etch, i.e., to prevent removal of too much silicon from the surface. In various embodiments, the partially-processed silicon cell may be dipped a second time in hydrofluoric acid for less than about 45 seconds. In various embodiments, aluminum back electrode 514 is not brought into contact with hydrofluoric acid or sodium hydroxide during the cleaning process. In various embodiments, other suitable cleaning methods are used.

Partially-processed silicon solar cell 600 may be placed in container 510 and oriented so the light shines on n-type surface 626 of partially-processed silicon solar cell 600. N-type surface 626 may be in contact with ionic liquid 530. During light-induced plating, aluminum deposits onto n-type surface 626 to form a finger electrode 120 (with momentary reference to FIG. 1c).

With reference again to FIGS. 2a and 2b, light-induced aluminum plating may be carried out in a two-electrode configuration with anode 512 and cathode 514. A mesh made of high-purity aluminum wire may be used as anode 512. In various embodiments, anode 512 is a sacrificial anode. In various embodiments, anode 512 is dissolved during light-induced aluminum plating and may be periodically replaced. Anode 512 may be cleaned by a short dip in an aqueous solution of hydrochloric acid, followed by a rinse in deionized water. In various embodiments, the concentration of hydrochloric acid is 37%. The positive terminal of a direct-current power supply 508 may be connected to anode 512, and cathode 514 may be connected to the negative terminal of the direct-current power supply. In various embodiments, cathode 514 comprises a back side aluminum layer of partially-processed silicon solar cell 600.

Cathode 514 may be isolated from ionic liquid 530, leaving only silicon nitride layer 622 and/or n-type surface 626 at least partially immersed in ionic liquid 530. In various embodiments and with reference to FIG. 2b, a frame 540 may be used to at least partially immerse partially-processed silicon solar cell 600 in ionic liquid 530. In various embodiments, the frame comprises a lower carrier 542 and an upper carrier 544. Lower carrier 542 may be configured to surround an outer perimeter of partially-processed silicon solar cell 600. Lower carrier 542 may comprise an inner flange and may define a central aperture such that partially-processed silicon solar cell 600 may be seated on the inner flange with n-type surface 626 generally disposed within and/or above the central aperture. In various embodiments, upper carrier 544 is configured to be coupled to at least one of lower carrier 542 and partially-processed silicon solar cell 600. Upper carrier 544 may be configured to create a liquid-tight seal between partially-processed silicon solar cell 600 and the inner flange. In various embodiments, frame 540 is configured to allow ionic liquid 530 to partially or fully contact n-type surface 626 while preventing contact between ionic liquid 530 and other portions of partially-processed silicon solar cell 600, including cathode 514.

In various embodiments, light emitted from light source 504 passes through ionic liquid 530 and shines on n-type surface 626. The temperature of ionic liquid 530 may be raised and maintained at between about room temperature and about 150° C. during the plating process. The temperature of ionic liquid 530 may be raised and/or maintained by heat source 506. In various embodiments, heat source 506 comprises heat tape disposed on an outer surface of container 510. However, heat source 506 may comprise any suitable means of heating and/or maintaining an elevated temperature of ionic liquid 530 disposed in container 510. In various embodiments, the temperature of ionic liquid 530 during the plating process is between about 20° C. and about 150° C. In various embodiments, the temperature of ionic liquid 530 during the plating process is about 25° C. In various embodiments, the temperature of ionic liquid 530 during the plating process is about 60° C. As demonstrated in FIGS. 7a-8d, inclusive, thickness of aluminum deposits may increase as ionic liquid temperature increases.

In response to applying light to n-type surface 626 and to applying a suitable voltage or current between anode 512 and cathode 514, aluminum deposition on n-type surface 626 begins. In various embodiments, plating can be carried out under a constant current, a pulse current, a constant voltage, and/or a pulse voltage between anode 512 and cathode 514. In various embodiments, the current does not exceed the photo-generated current of the partially-processed silicon solar cell 600. The photo-generated current may be light-induced and/or may be determined by the intensity of light emitted by light source 504.

Figure 7A:
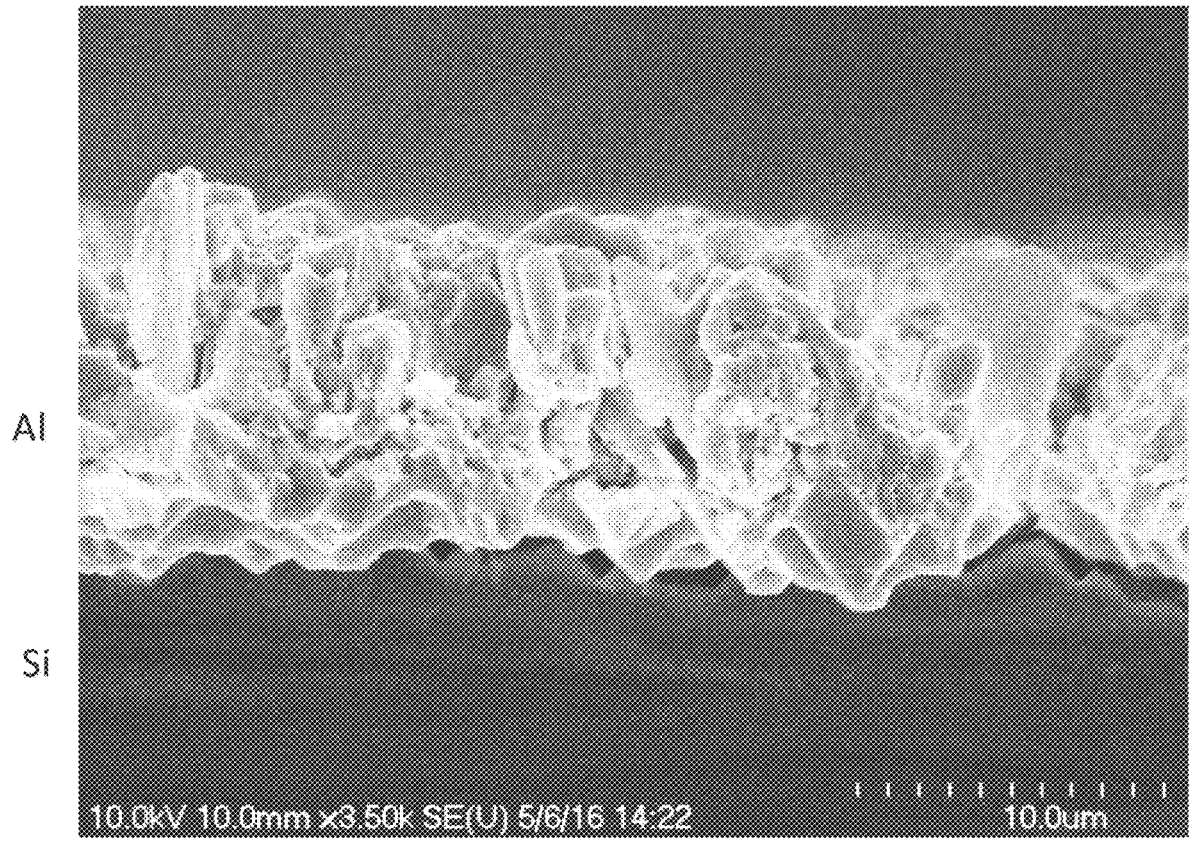
FIG. 7a is a scanning electron microscopy image of light-induced aluminum on an n-type silicon solar cell with a back electrode, in accordance with an exemplary embodiment.
Figure 7B:
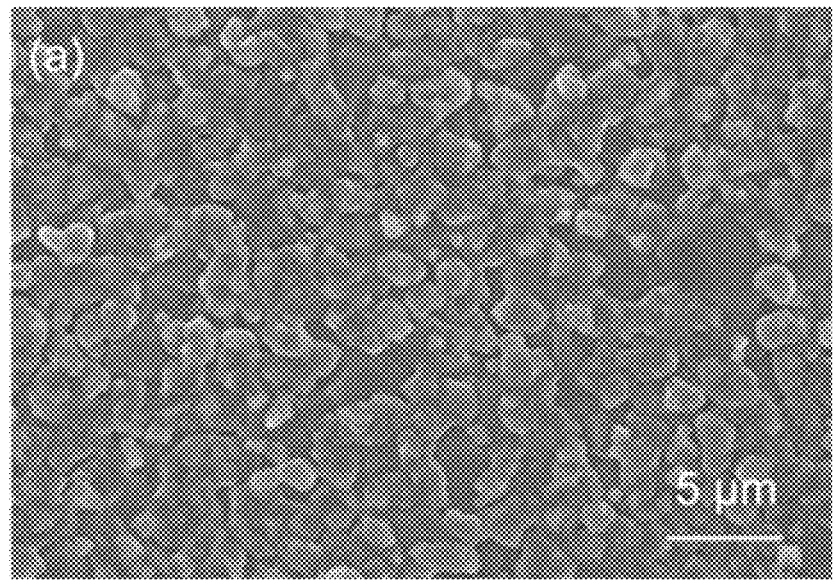
FIG. 7b is a scanning electron microscopy image of light-induced aluminum plated at 25° C. on an n-type silicon solar cell with a back electrode, in accordance with an exemplary embodiment.
Figure 7C:
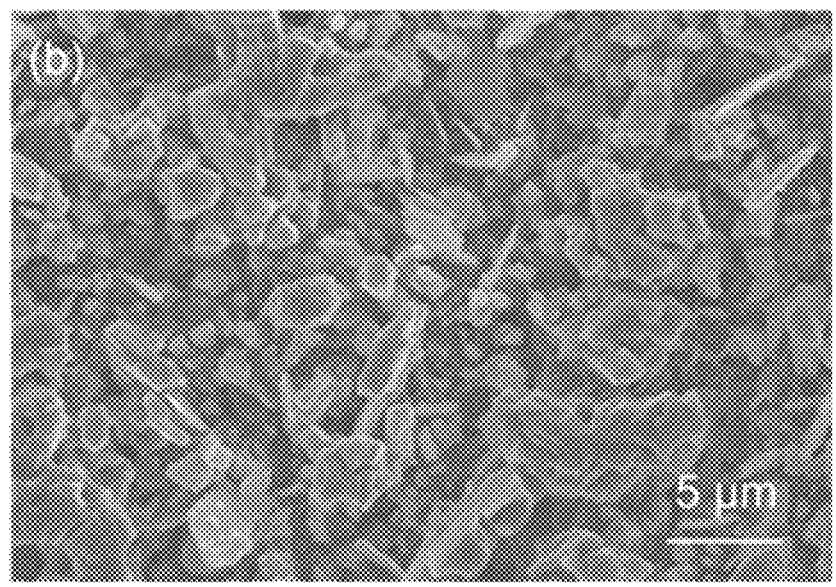
FIG. 7c is a scanning electron microscopy images of light-induced aluminum plated at 60° C. on an n-type silicon solar cell with a back electrode, in accordance with an exemplary embodiment.

Aluminum deposits on partially-processed silicon solar cell generated in accordance with principles of the present disclosure have been characterized. FIG. 7 is a scanning electron microscopy image of light-induced aluminum deposits on an n-type silicon cell with a back emitter. Large grains of aluminum are observed. In various embodiments and with reference to FIG. 8a, energy dispersive x-ray spectroscopy reveals only aluminum on the aluminum/silicon stack. In various embodiments and with reference to FIG. 8b, energy dispersive x-ray spectroscopy of light-induced aluminum deposits plated at 25° C. displays a strong peak at 1.49 keV verifying that the deposit is largely aluminum. The weak peaks of oxygen and chlorine are residues from the ionic liquid. The absence of any silicon peak indicates that the aluminum deposit completely covers the silicon surface, i.e. the aluminum deposit is continuous on the n-type surface.

Figure 8A:
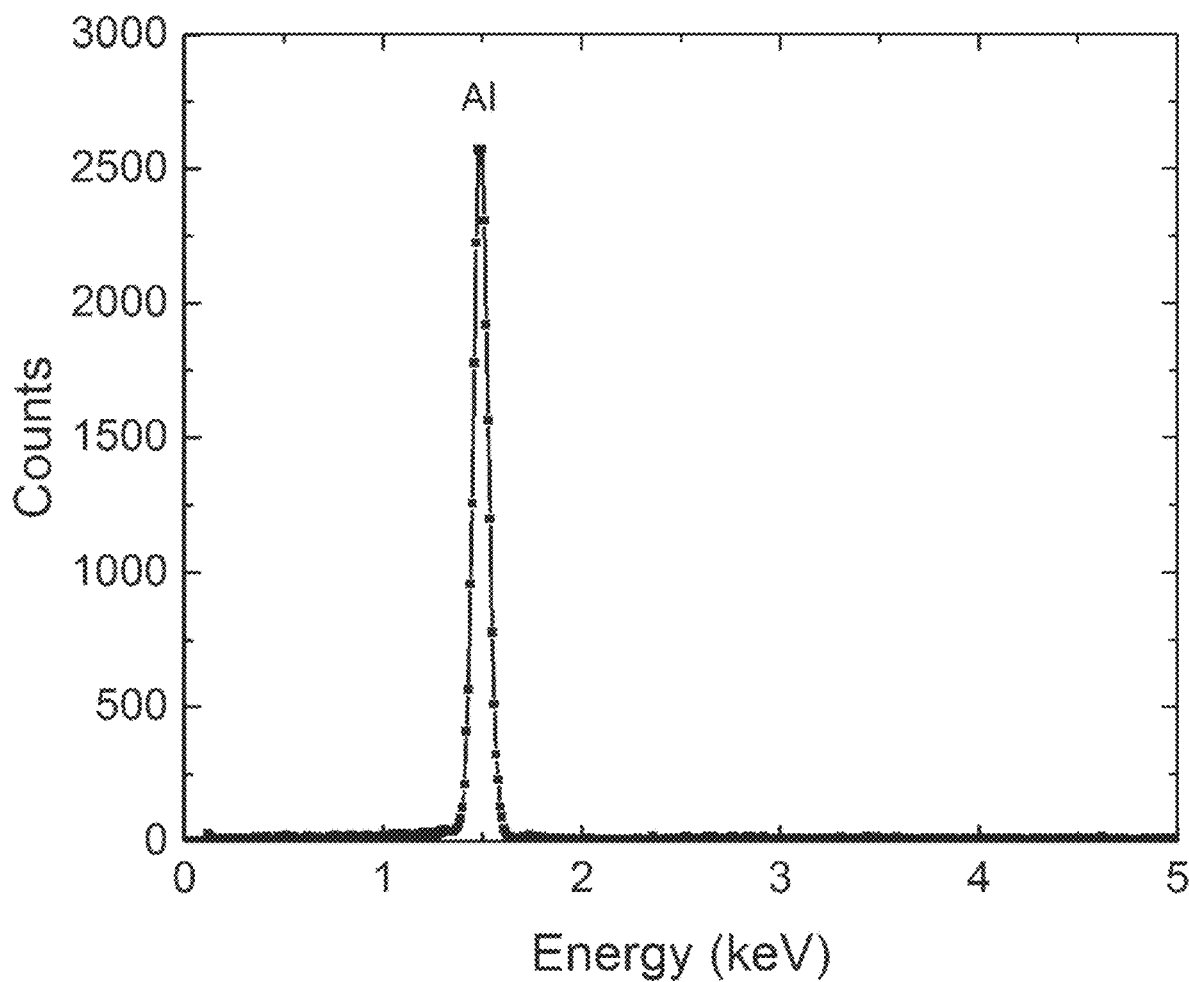
FIG. 8a illustrates an energy dispersive x-ray spectroscopy spectrum of light-induced aluminum on an n-type silicon solar cell with a back emitter, in accordance with an exemplary embodiment.
Figure 8B:
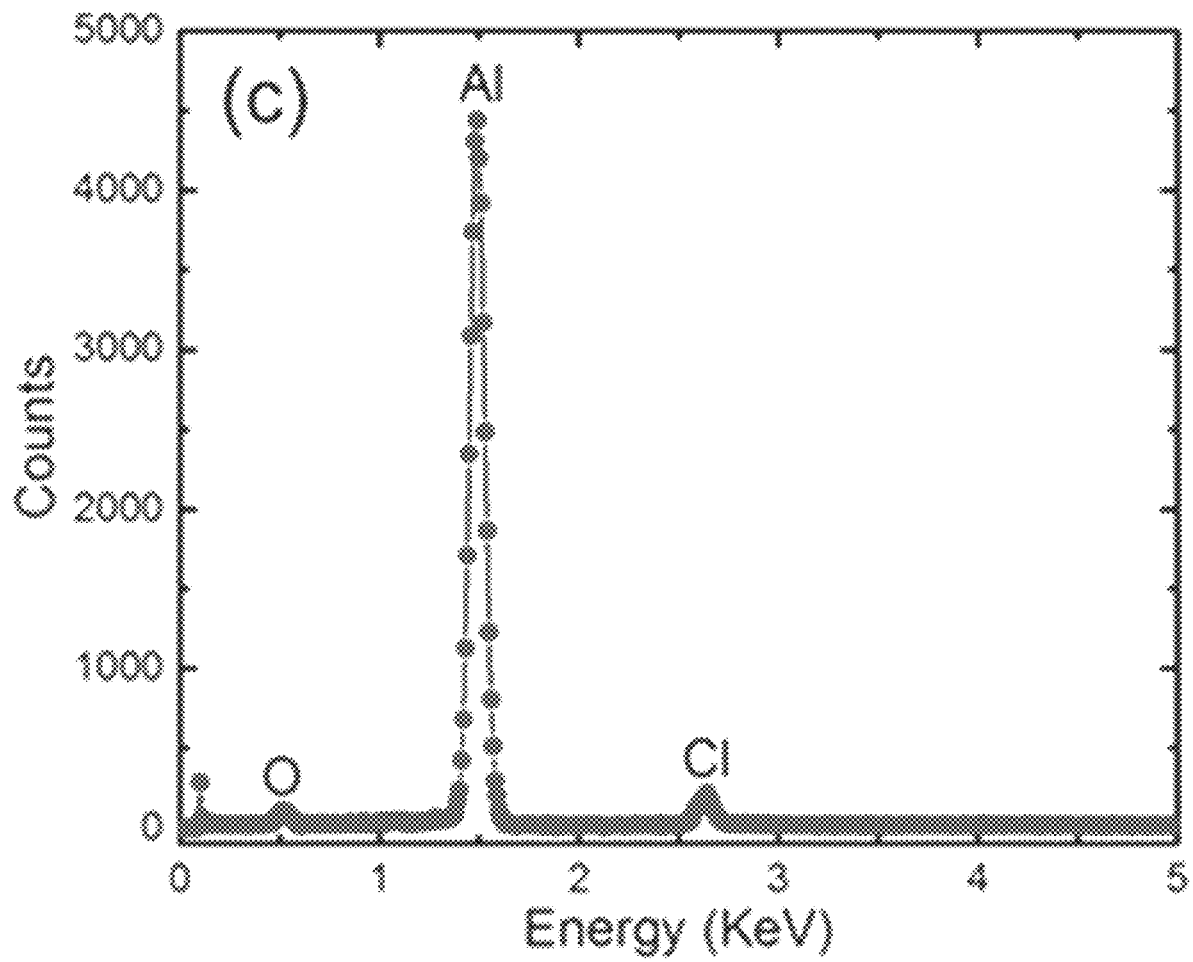
FIG. 8b illustrates an energy dispersive x-ray spectroscopy spectrum of light-induced aluminum plated at 25° C. on an n-type silicon solar cell with a back electrode, in accordance with an exemplary embodiment.
Figure 8C:
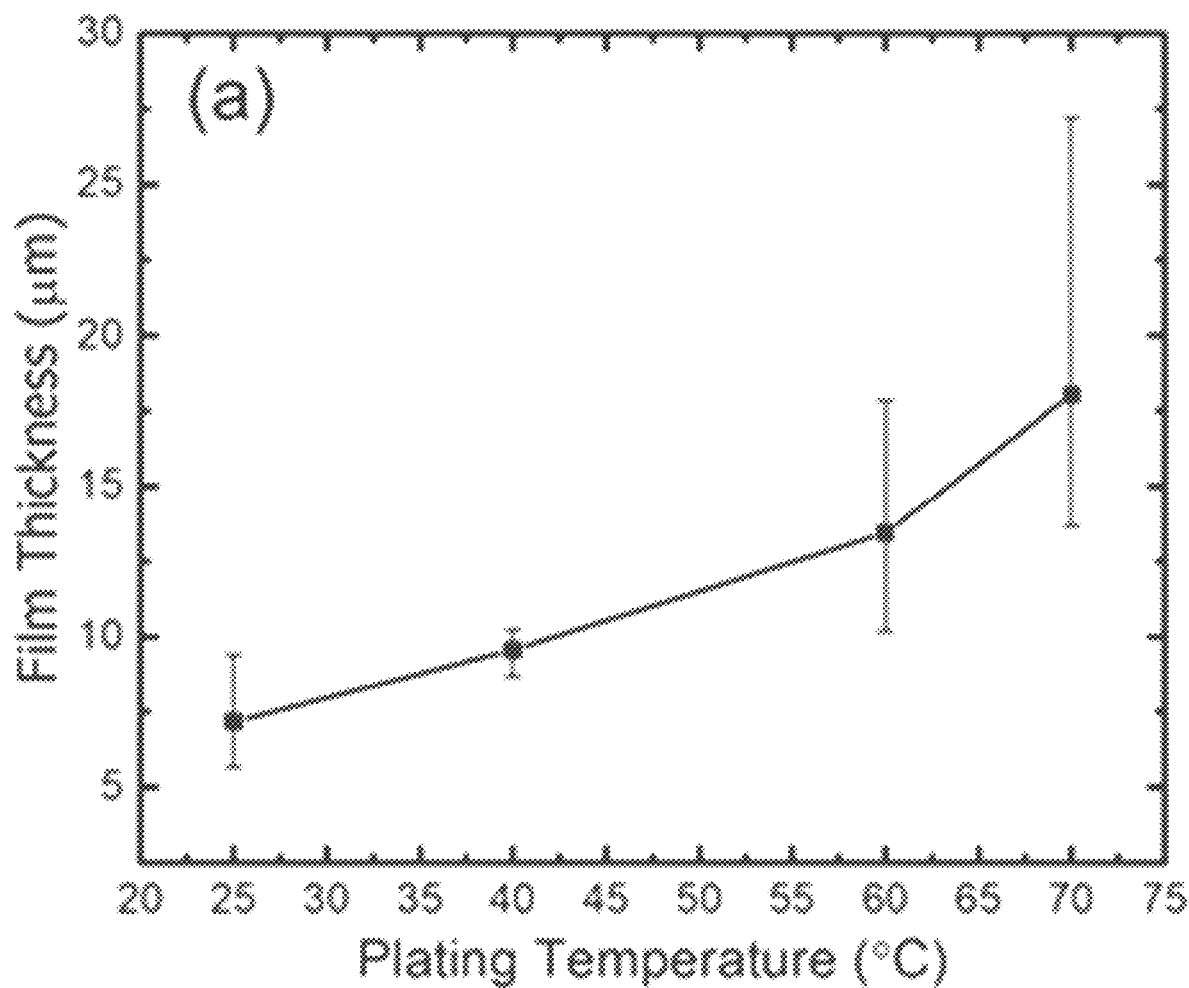
FIG. 8c illustrates thickness of light-induced aluminum deposits as a function of plating temperature.
Figure 8D:
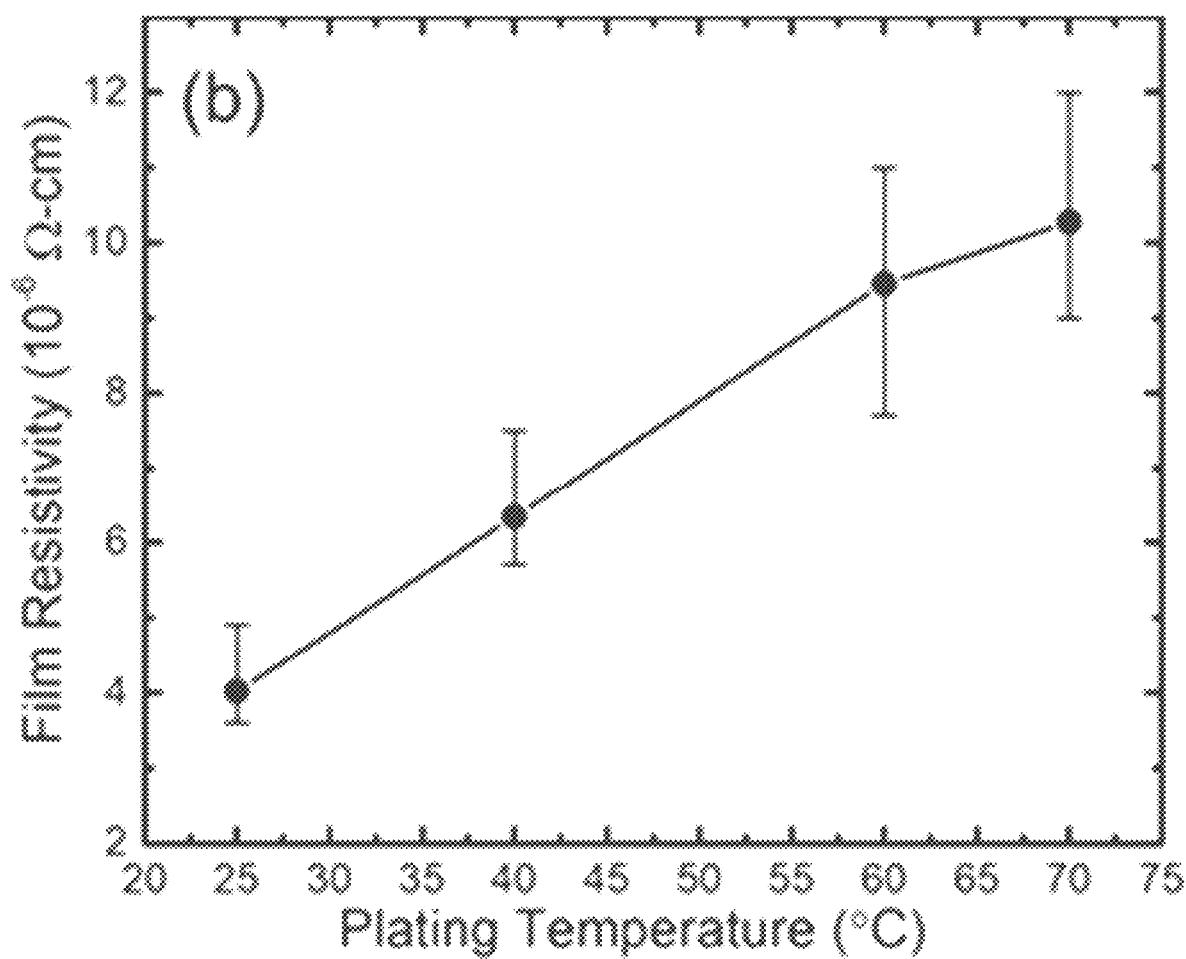
FIG. 8d illustrates resistivity of light-induced aluminum deposits as a function of plating temperature.

The thickness of aluminum deposits on silicon solar cells was measured by a profilometer. FIG. 8c shows the average thickness at different plating temperatures. Although the plating current and time were kept consistent, the average thickness and its variation increased with temperature. The resistance of the aluminum deposits was measured with a four-probe method. With the aluminum deposit dimensions of 10×0.5 mm$^2$, the resistivity of the aluminum deposits was determined. FIG. 8d shows the resistivity of the aluminum deposits as a function of plating temperature. The lowest average resistivity is about 4×10$^{-6}$ Ohm-cm at 25° C., which is about 1.5 times that of bulk aluminum. It is lower than the resistivity of 7×10$^{-6}$ Ohm-cm by conventional aluminum electroplating. Based on resistance measurements and the thickness of the aluminum deposit, the resistivity of as-deposited aluminum may be about 5×10$^{-6}$ Ohm-cm. In various embodiments, the resistivity of as-deposited aluminum is at least as low as 4×10$^{-6}$ Ohm-cm. These values are lower than that of screen-printed silver and qualify light-induced aluminum as a substitute for screen-printed silver in silicon solar cells.

Although a sacrificial aluminum anode is used in various exemplary embodiments, the concentration of aluminum in the ionic liquid may still decrease as the plating process goes on. When the plating current is too large, the anode dissolution rate may fail to catch up with the deposition rate of aluminum on the cathode leading to depletion of aluminum in the ionic liquid. If an abnormally low current is observed, additional AlCl$_3$ may be added to the ionic liquid to maintain the aluminum concentration therein. The ionic liquid itself can be reused for many runs of aluminum deposition if it is kept under vacuum or inert gas, or at a temperature of about 100° C. or greater, with a more or less constant aluminum concentration.

Silicon Solar Cells with a Light-Induced Aluminum Electrode

Figure 9:
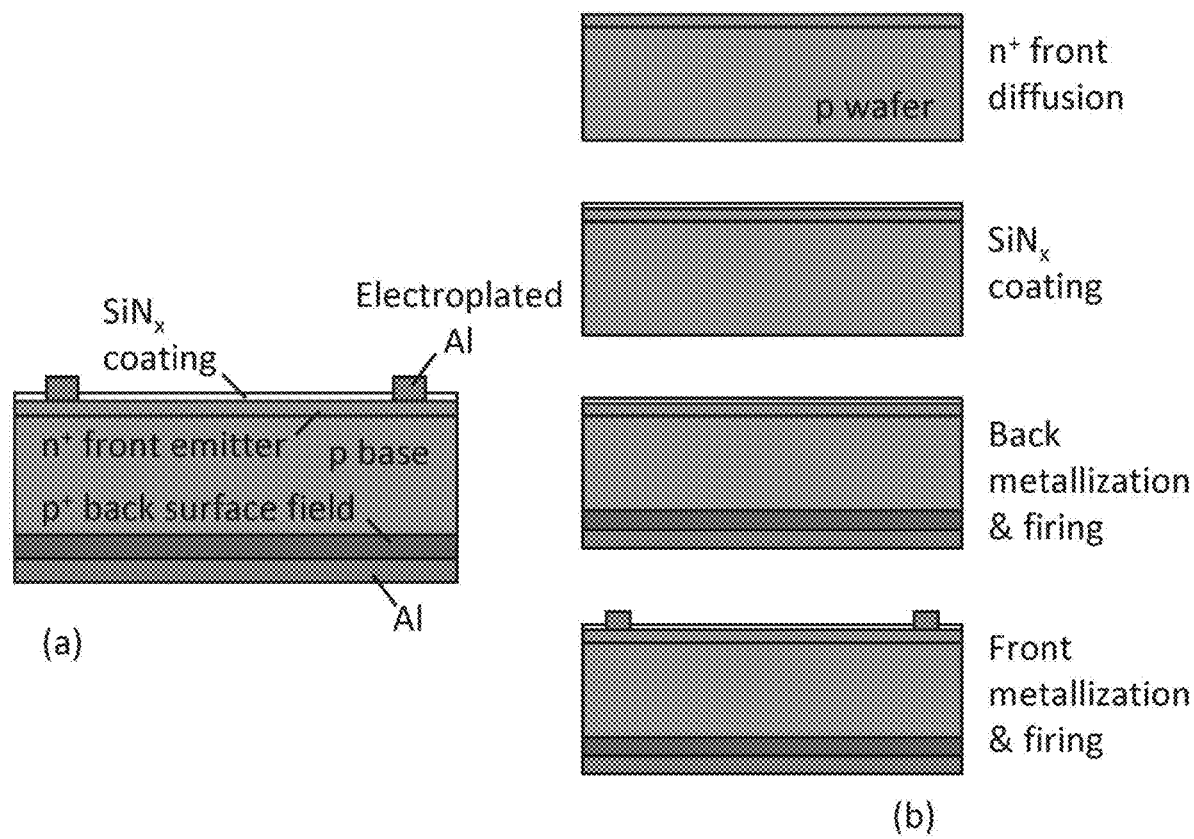
FIG. 9 illustrates a p-type aluminum back-surface field silicon solar cell structure with a light-induced aluminum front electrode in accordance with an exemplary embodiment.
Figure 10:
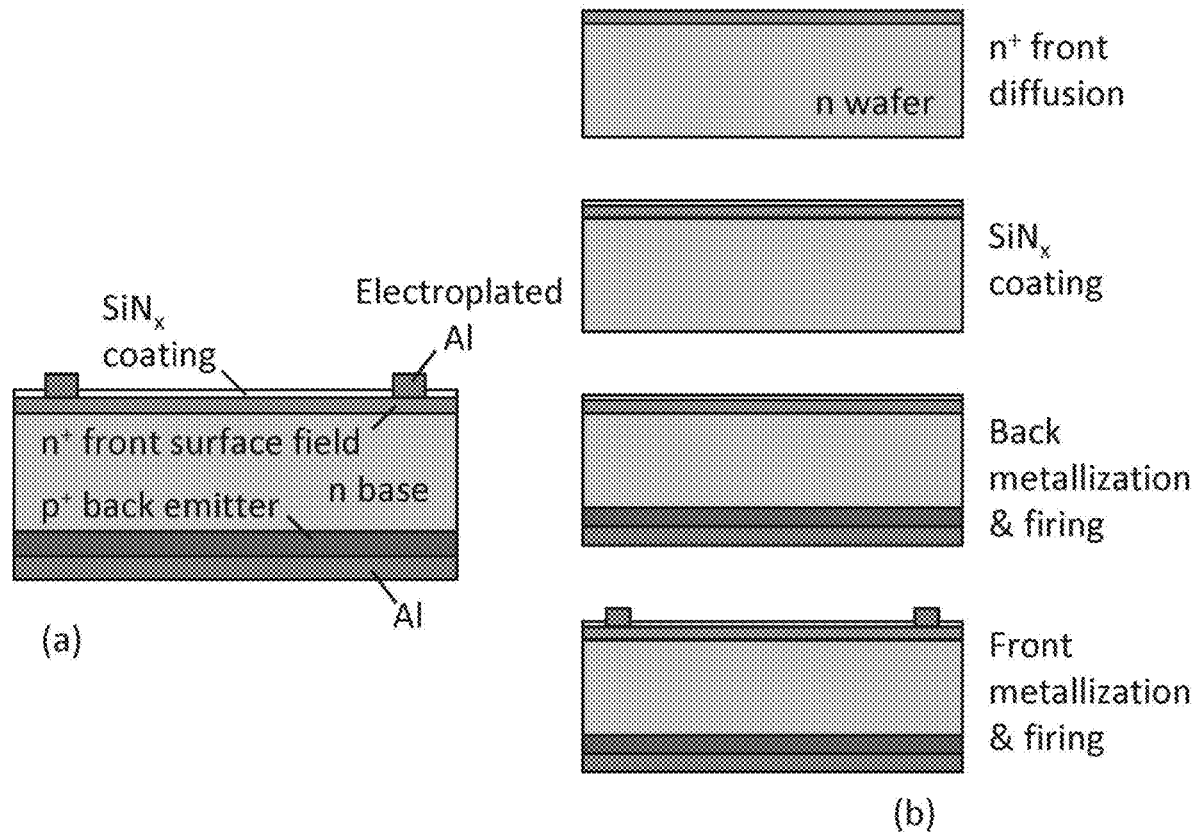
FIG. 10 illustrates a n-type back-emitter silicon solar cell structure with a light-induced aluminum front electrode in accordance with an exemplary embodiment.
Figure 11:
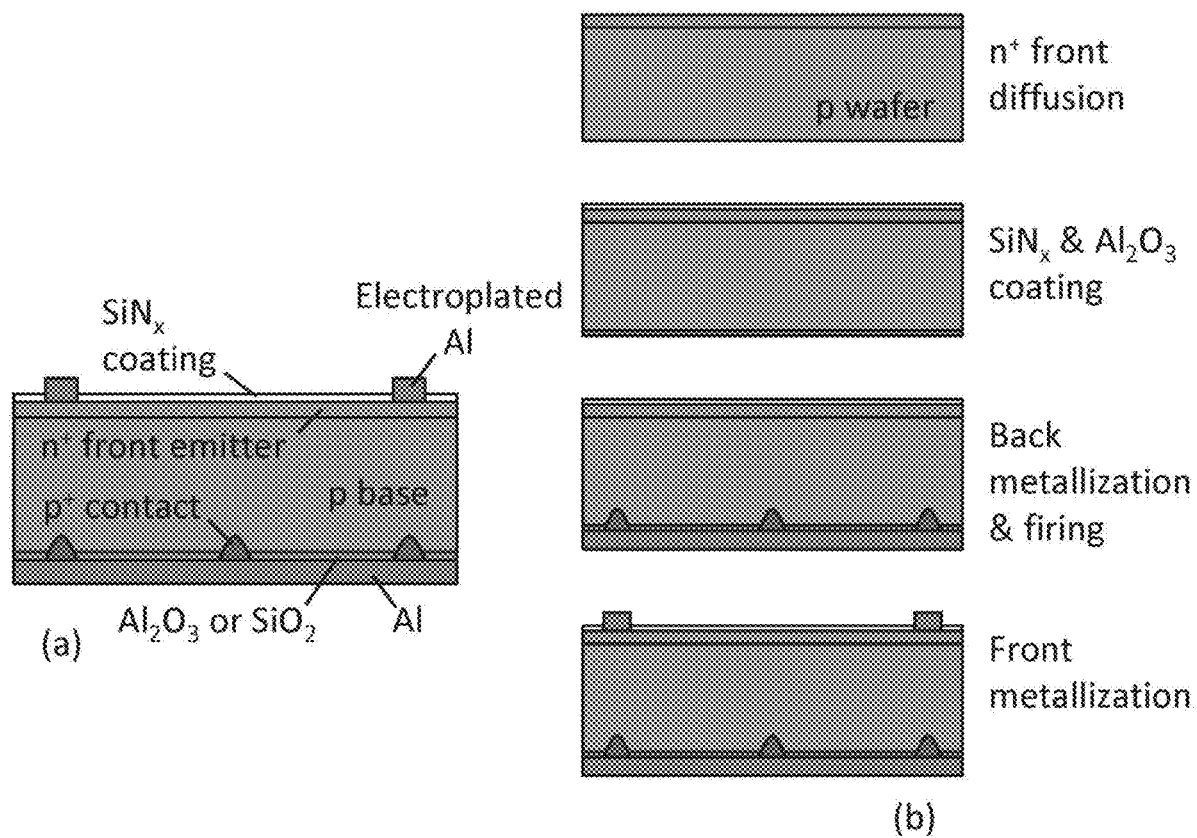
FIG. 11 illustrates a p-type passivated emitter rear contact silicon solar cell structure with an light-induced aluminum front electrode in accordance with an exemplary embodiment.
Figure 12:
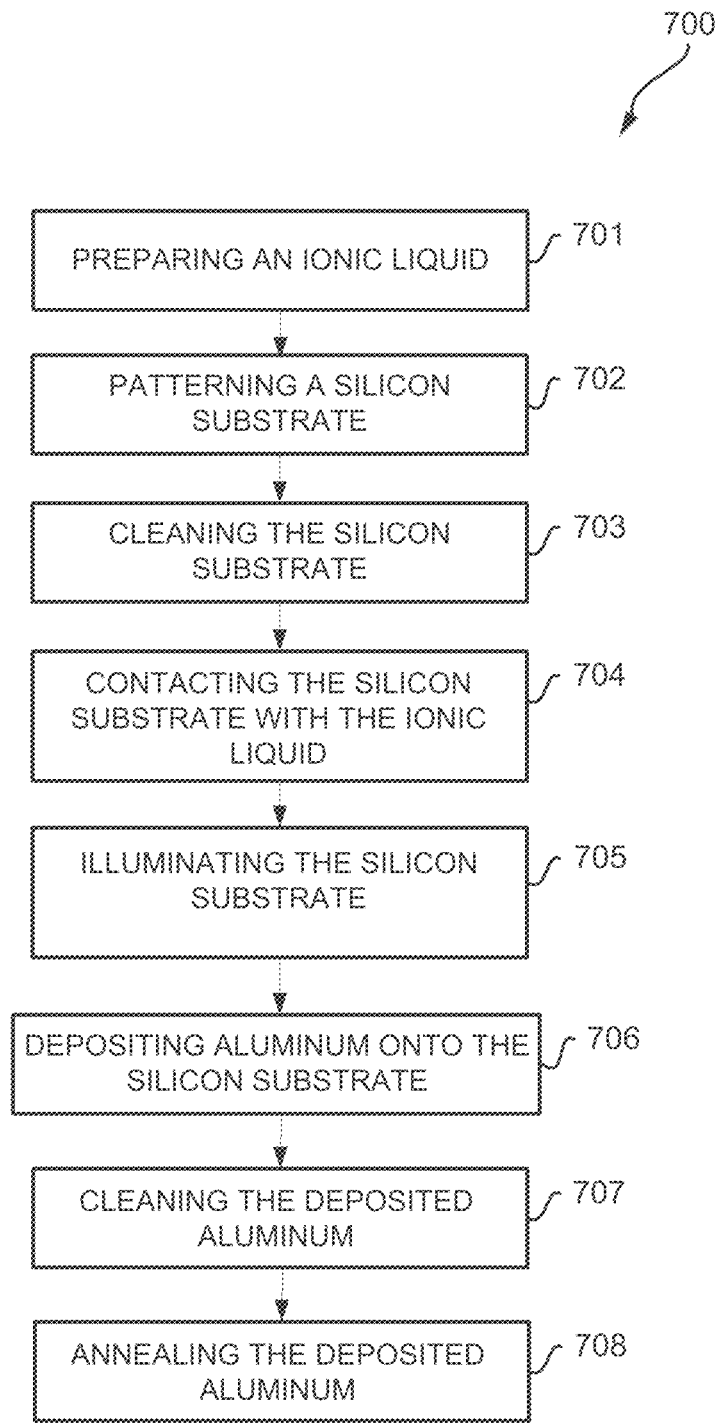
FIG. 12 illustrates a method of light-induced aluminum plating on a silicon nitride layer of an n-type silicon solar cell with a back electrode, in accordance with an exemplary embodiment.

Principles of the present disclosure contemplate examples of silicon solar cells which are compatible with light-induced aluminum as the front finger electrode. The back-side aluminum electrode in these solar cells remains screen-printed. Some of these silicon solar cells and their fabrication processes are schematically illustrated in FIG. 9, FIG. 10, and FIG. 11.

A common commercial silicon solar cell is the p-type aluminum back-surface field cell as shown in FIG. 9a. It features a p-type silicon wafer, an n-type front emitter, and an aluminum-doped back-surface field. The fabrication process for this solar cell with a light-induced aluminum front electrode is schematically shown in FIG. 9b. It starts with a p-type silicon wafer with an appropriate boron concentration. After surface texturing and cleaning, the diffusion on the front side of the wafer forms an n+ layer with an appropriate concentration and an appropriate depth of phosphorus, which is the emitter of the solar cell. A layer of silicon nitride is deposited on the front side of the wafer after diffusion by plasma-enhanced chemical vapor deposition. Aluminum metallization on the back side is performed first. It is realized by screen printing of aluminum. After the back aluminum electrode is formed and before the front finger electrode is fabricated, the silicon wafer is heated to a suitable temperature, for example between 700° C. and 900°

C., to fuse aluminum into silicon. It forms a layer of high aluminum concentration on the back side of the silicon wafer. After the high-temperature firing, the front side silicon nitride layer is patterned for the front finger electrode. The patterning can be realized by laser ablation, lithography or any other suitable patterning technique. The partially-processed solar cell is then placed in a light-induced aluminum plating system 500 to fabricate the front aluminum electrode by light-induced plating, as described herein. Finally the solar cell is annealed again at a moderate temperature between 100° C. and 500° C. to complete the fabrication process. In various embodiments, annealing the solar cell may decrease resistivity of the deposited aluminum. In various embodiments, the annealing may occur for between about thirty second and five minutes. However, the annealing may occur at any suitable temperature and for any suitable time.

FIG. 10a illustrates an n-type back-emitter cell with a light-induced aluminum front electrode. FIG. 10b illustrates a fabrication process for an n-type back-emitter cell with a light-induced aluminum front electrode. An n-type silicon wafer with an appropriate phosphorus concentration is textured and cleaned. The diffusion on the front side of the wafer then forms a n+ layer with a proper concentration and an appropriate depth of phosphorus, which is the front surface field of the cell. A layer of silicon nitride is deposited on the front side of the wafer after diffusion by plasma-enhanced chemical vapor deposition. Aluminum metallization on the back side is performed first by screen printing. After the back side aluminum electrode is formed and before the front finger electrode is fabricated, the silicon wafer is heated to a temperature between 7000° C. and 900° C. to fuse aluminum into silicon. It forms a layer of high aluminum concentration on the back side of the silicon wafer, which is the p+ emitter of the cell. After the high-temperature firing, the front silicon nitride layer is patterned for the front finger electrode. The patterning can be realized by laser ablation, lithography or any other suitable patterning technique. Light-induced plating of aluminum is then performed on the front side of the wafer, as described above. Finally the cell is heated to a moderate temperature between 100° C. and 500° C. for the formation of the front electrical contact.

It will be appreciated that the light-induced aluminum plating process disclosed herein also works for high-efficiency cells such as passivated-emitter rear contact (PERC) cells. As an example, FIG. 11a illustrates a p-type PERC cell with a light-induced aluminum front electrode and FIG. 11b illustrates a fabrication process for such a cell. The starting wafer for this cell is p-type. After cleaning and surface texturing, phosphorus is diffused into the front side of the wafer to form an n+ layer as the emitter of the cell. A silicon nitride layer is deposited by plasma-enhanced chemical vapor deposition on the front side of the wafer, i.e. the phosphorus-diffused side. On the back side of the wafer, an aluminum oxide layer is deposited by atomic layer deposition. A silicon nitride layer follows the aluminum oxide layer by plasma-enhanced chemical vapor deposition.

In various embodiments, the back side aluminum electrode of a silicon solar cell is formed by a method of laser annealing, in which an aluminum layer is screen-printed onto the aluminum oxide/silicon nitride stack on the back side of the wafer. After heating and drying the screen-printed aluminum layer, a laser is employed to locally heat the back side of the wafer through the aluminum layer. The laser annealing may allow the aluminum layer to penetrate the aluminum oxide/silicon nitride stack and form a p+ region of high aluminum concentration under the laser spot. An array of p+ regions may be created by moving the laser spot across the back surface, which provides localized p+ emitter for the cell.

In various embodiments, the back side aluminum electrode of a silicon solar cell is formed by a method of patterning, in which a patterning technique (for example, lithography or laser ablation) is employed to create openings in the aluminum oxide/silicon nitride stack. An aluminum layer is then screen-printed on the patterned aluminum oxide/silicon nitride stack. The wafer is then fired between 700° C. and 900° C. to form localized p+ emitter in the cell.

Finally the front silicon nitride layer on the n-type emitter, is patterned by either laser ablation or lithography to expose an n-type surface. Light-induced aluminum plating is then performed on the patterned silicon nitride layer or n-type surface. A final anneal at a moderate temperature between 100° C. and 500° C. completes solar cell fabrication.

Capping Layer for Light-Induced Aluminum

Principles of the present disclosure also contemplate a capping layer for the light-induced aluminum electrode, as shown in FIG. 1c. The capping layer may comprise zinc, tin, or any other suitable material. The capping layer may improve solderability of the light-induced aluminum electrode. A solderable capping layer may be desirable for the aluminum electrode. In various embodiments, a zinc capping layer is preferable because its price is lower, its melting point is higher, and its resistance is lower than other materials.

In various embodiments, the capping layer is fabricated on an aluminum electrode by conventional electroplating and/or light-induced plating. An exemplary plating solution contains 30 g/L zinc chloride and 200 g/L potassium chloride with a pH value of about 5.5. The plating is carried out with two electrodes, an anode and a cathode. The anode is an inert metal such as titanium and the cathode is a silicon cell with a light-induced aluminum front electrode. Conventional plating of zinc may be performed with a constant current of about 10 mA/cm$^2$ and at room temperature. For light-induced plating of zinc, a system similar to those described herein may be used, and a heat sources and/or enclosure for vacuum or inert gas may be omitted from such a system. The thickness of the capping layer may be between 1 and 3 micrometers. The capping layer may be fabricated directly after light-induced aluminum plating, and the final anneal may be carried out after zinc plating.

Example 1

An ionic liquid was prepared by adding anhydrous aluminum chloride ($AlCl_3$) powder (99%, Aldrich) to 1-ethyl-3-methylimidazolium tetrachloroaluminate (($EMIm$)$AlCl_4$) (≥95%, Aldrich) in a beaker on a hot plate in a nitrogen box to drive out any moisture in the ionic liquid. The molar ratio between $AlCl_3$ and ($EMIm$)$AlCl_4$ was 0.5 to keep it a Lewis acid for Al plating. The solution was stirred to dissolve all the $AlCl_3$ power.

Figure 2B:
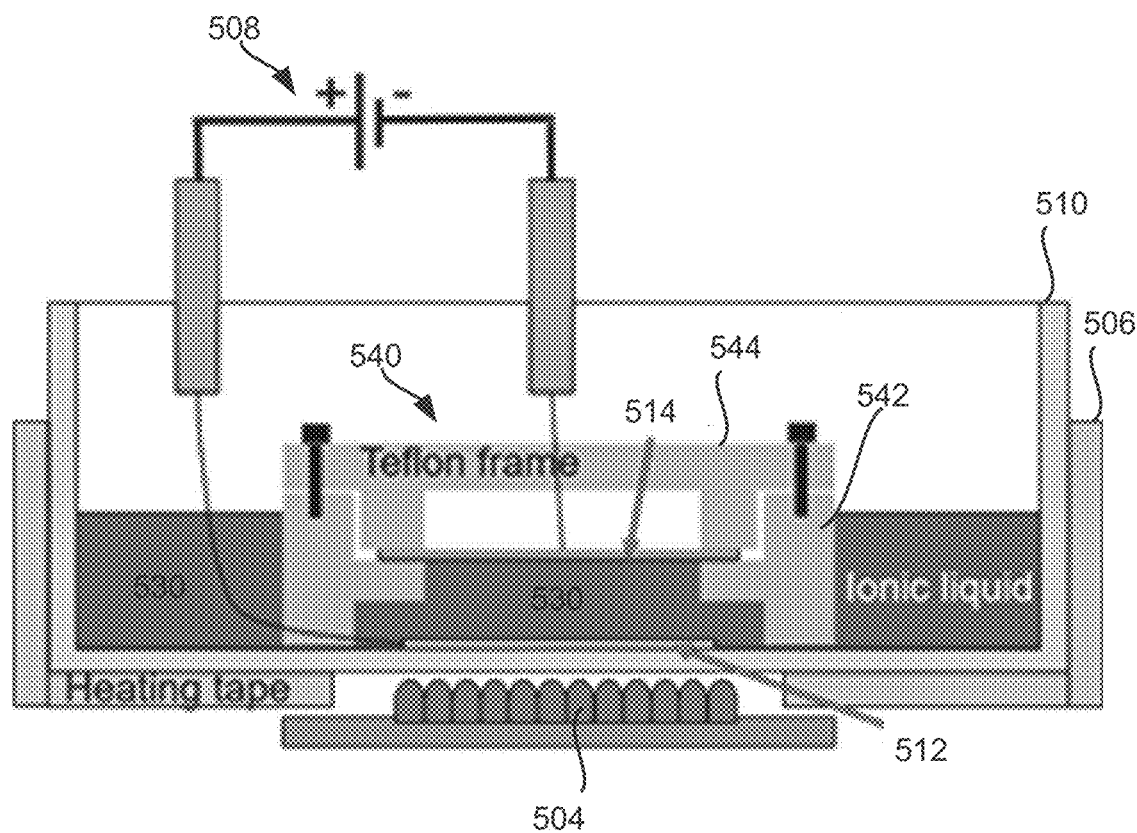

The prepared ionic liquid was transferred into a glass container, as illustrated in FIG. 2b. The tank was wrapped in a heating tape and placed on a frame with a round hole in the center. An array of light-emitting diodes (LEDs) with a wavelength of 620 nm shed light from the bottom of the container. A high-purity aluminum mesh was placed in front of the silicon sample as the anode, which was dissolved during plating to supply the depleted aluminum ions to the ionic liquid.

The sample was a silicon p-n junction. It had a 75-nm silicon nitride ($SiN_x$) layer covering the n-type emitter and screen-printed aluminum on the p-type base. The $SiN_x$ layer was patterned with openings of $10 \times 0.5$ mm² by laser ablation where silicon n-type surface was exposed. The sample was cleaned in 2% hydrofluoric acid (HF) for 30 seconds and then immersed in 3% sodium hydroxide (NaOH) for 15 seconds at room temperature to remove laser damage. With a final HF dip, the sample was placed on the sample holder with the pattern facing down and contacting the ionic liquid. The backside aluminum on the sample served as the cathode for plating. The voltage applied between anode and cathode was controlled by a Gamry Reference 3000 potentiostat to achieve a plating current of about 40 mA/cm². The plating temperature was between 25° C. and 70° C.

The photo-generated electrons in the sample were driven to the n-type emitter by the p-n junction. The $Al_2Cl_7^-$ ions in the ionic liquid are reduced by the photo-generated electrons and form metallic aluminum deposit on the silicon n-type surface according to:

$$4Al_2Cl_7^- + 3e^- \leftrightarrow Al + 7AlCl_4^-$$

The applied voltage between anode and cathode was selected to more effectively extract the photo-generated electrons to the n-type emitter surface. The plating current became practically zero when the light was turned off.

After plating, the sample was rinsed with methanol ($CH_3OH$) and distilled water before being blown dry with nitrogen. The morphology and composition of the aluminum deposits were characterized by scanning electron microscopy (SEM) and energy dispersive X-ray spectroscopy (EDX). Profilometry was used to measure the thickness of the aluminum deposits. The resistance of the aluminum deposits was measured with a four-probe method which eliminates the effect of contact resistance.

A method 700 for light-induced electroplating of aluminum directly onto a silicon substrate is disclosed herein. In various embodiments, the method comprises preparing an ionic liquid comprising aluminum chloride ($AlCl_3$) and an organic halide (Step 701), placing the silicon substrate into the ionic liquid (Step 704), illuminating the silicon substrate (Step 705), and depositing aluminum onto the silicon substrate via a light-induced electroplating process (Step 706), wherein the light-induced electroplating process utilizes an applied current that does not exceed a photo-generated current generated by the illumination.

In various embodiments, the method may comprise cleaning the silicon substrate with at least one of hydrogen fluoride, hydrogen chloride, hydrogen peroxide, sodium hydroxide, potassium hydroxide, or ammonium hydroxide (Step 703). In various embodiments, the method may comprise patterning the silicon nitride layer of a partially-processed silicon solar cell to expose the silicon n-type surface (Step 702). In various embodiments, the method may comprise cleaning the deposited aluminum with deionized water (Step 707). In various embodiments, the method may comprise annealing the deposited aluminum and the silicon substrate to reduce a resistivity of the deposited aluminum (Step 708).

While the principles of this disclosure have been shown in various embodiments, many modifications of structure, arrangements, proportions, elements, materials and components, used in practice, which are particularly adapted for a specific environment and operating requirements may be used without departing from the principles and scope of this disclosure. These and other changes or modifications are intended to be included within the scope of the present disclosure.

The present disclosure has been described with reference to various embodiments. However, one of ordinary skill in the art appreciates that various modifications and changes can be made without departing from the scope of the present disclosure. Accordingly, the specification is to be regarded in an illustrative rather than a restrictive sense, and all such modifications are intended to be included within the scope of the present disclosure. Likewise, benefits, other advantages, and solutions to problems have been described above with regard to various embodiments. However, benefits, advantages, solutions to problems, and any element(s) that may cause any benefit, advantage, or solution to occur or become more pronounced are not to be construed as a critical, required, or essential feature or element.

When a phrase similar to "at least one of A, B, or C" or "at least one of A, B, and C" is used in the claims, the phrase is intended to mean any of the following: (1) at least one of A; (2) at least one of B; (3) at least one of C; (4) at least one of A and at least one of B; (5) at least one of B and at least one of C; (6) at least one of A and at least one of C; or (7) at least one of A, at least one of B, and at least one of C.

As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. Also, as used herein, the terms "coupled," "coupling," or any other variation thereof, are intended to cover a physical connection, an electrical connection, a magnetic connection, an optical connection, a communicative connection, a functional connection, and/or any other connection.

What is claimed is:

1. A method for processing a silicon solar cell, the method comprising:
   preparing an ionic liquid comprising aluminum chloride ($AlCl_3$) and an organic halide;
   patterning a partially-processed silicon solar cell to expose an n-type surface of a silicon substrate;
   bringing the n-type surface of the silicon substrate of the partially processed silicon solar cell into contact with the ionic liquid, wherein the n-type surface does not comprise a seed layer;
   illuminating the n-type surface, wherein the illumination passes through the ionic liquid, wherein the illumination is generated at least partially by a light source comprising at least one light-emitting diode, and wherein a photo-generated current is generated by the illumination;
   while illuminating the silicon substrate with the light source, applying a current between an anode and a cathode to generate an applied current, wherein the applied current generates a current density of between 30 milliamps per centimeter squared (mA/cm²) and 50 mA/cm²; and
   depositing aluminum onto the silicon substrate via a light-induced electroplating process, wherein the light-induced electroplating process utilizes the applied current that does not exceed the photo-generated current generated by the illumination.

2. The method of claim 1, wherein the light-emitting diode emits light having a wavelength of about 620 nanometers.

3. The method of claim 1, wherein the illumination is generated at least partially by a second light source having a wavelength of between 600 nanometers and 1000 nanometers.

4. The method of claim 1, wherein the organic halide is 1-ethyl-3-methylimidazolium tetrachloraluminate (EMIm-$AlCl_4$).

5. The method of claim 4, wherein a molar ratio between $AlCl_3$ and EMIm-$AlCl_4$ is kept at a Lewis acid for Al plating.

6. The method of claim 4, wherein a molar ratio between $AlCl_3$ and EMIm-$AlCl_4$ is 0.5.

7. The method of claim 1, further comprising cleaning the n-type surface with at least one of hydrogen fluoride, hydrogen chloride, hydrogen peroxide, sodium hydroxide, potassium hydroxide, or ammonium hydroxide.

8. The method of claim 1, wherein the light-induced electroplating process comprises applying a current between an aluminum back electrode of the partially-processed silicon solar cell and an aluminum mesh disposed in the ionic liquid.

9. The method of claim 1, further comprising cleaning the deposited aluminum with deionized water.

10. The method of claim 1, further comprising annealing the deposited aluminum on the silicon substrate to reduce the resistivity of the electroplated aluminum.

11. The method of claim 1, further comprising depositing a capping layer over the aluminum and the silicon substrate.

12. The method of claim 11, wherein the capping layer comprises at least one of zinc or tin.

13. The method of claim 11, wherein the capping layer is deposited via at least one of an electroplating process or a light-inducing plating process.

14. The method of claim 11, further comprising:
diffusing phosphorus onto a front side of a silicon wafer to form an n-type layer, wherein the n-type layer defines the n-type surface; and
depositing a layer of silicon nitride on the front side of the silicon wafer using plasma-enhanced chemical vapor deposition.

15. The method of claim 14, further comprising:
screen printing aluminum on a back side of the silicon wafer; and
heating the silicon wafer to fuse the aluminum into the back side of the silicon wafer to form the partially-processed silicon solar cell.

16. The method of claim 1, wherein the ionic liquid is disposed in a container having a transparent bottom, and wherein the illumination is provided by light emitting diodes disposed below the bottom of the container.

17. The method of claim 1, wherein the depositing is performed without use of a secondary tank for an oxidation reaction.

18. The method of claim 1, wherein the applied current is applied using the anode connected to a positive terminal of a direct-current power supply and the cathode connected to a negative terminal of the direct-current power supply, and wherein the cathode includes a back side aluminum layer of the partially-processed silicon solar cell.

19. The method of claim 18, wherein the cathode is isolated from the ionic liquid during the light-induced electroplating process.

* * * * *